United States Patent
Ulrich et al.

(10) Patent No.: US 9,448,140 B2
(45) Date of Patent: Sep. 20, 2016

(54) SERVICE DEVICE FOR AIR-CONDITIONING SYSTEMS

(71) Applicant: REFCO Manufacturing Ltd., Hitzkirch (CH)

(72) Inventors: Manfred Ulrich, Hitzkirch (CH); Ulrich Demuth, Erbach (DE)

(73) Assignee: REFCO Manufacturing Ltd., Hitzkirch (CH)

( * ) Notice: Subject to any disclaimer, the term of this patent is extended or adjusted under 35 U.S.C. 154(b) by 0 days.

(21) Appl. No.: 14/432,251

(22) PCT Filed: Nov. 19, 2012

(86) PCT No.: PCT/EP2012/072996
§ 371 (c)(1),
(2) Date: Mar. 30, 2015

(87) PCT Pub. No.: WO2014/053195
PCT Pub. Date: Apr. 10, 2014

(65) Prior Publication Data
US 2015/0241316 A1   Aug. 27, 2015

(30) Foreign Application Priority Data

Oct. 1, 2012 (DE) .......................... 10 2012 019 616
Nov. 8, 2012 (DE) .................... 20 2012 010 642 U

(51) Int. Cl.
*G01M 99/00* (2011.01)
*F25B 45/00* (2006.01)
*G01K 11/00* (2006.01)
(Continued)

(52) U.S. Cl.
CPC ............ *G01M 99/008* (2013.01); *F25B 45/00* (2013.01); *G01K 11/00* (2013.01); *G01L 19/083* (2013.01); *G08B 21/182* (2013.01);
(Continued)

(58) Field of Classification Search
CPC .. B60H 1/00585; F25B 45/00; F24F 11/001; G01K 13/02; G01L 19/0092; G01L 19/083; G08B 21/182
USPC ............ 340/611, 614, 626; 62/77, 149, 192, 62/292, 474; 73/753, 756, 733
See application file for complete search history.

(56) References Cited

U.S. PATENT DOCUMENTS 5,311,745 A * 5/1994 Lockhart ............... G01L 19/083
62/127
5,673,038 A * 9/1997 McLatchy ............. G01L 19/083
340/870.21
(Continued)

FOREIGN PATENT DOCUMENTS

DE   202008000837 U1   6/2008

OTHER PUBLICATIONS

English translation and original German publication of International Search Report and Written Opinion issued by the EPO in international application No. PCT/EP2012/072996 on May 14, 2013.

Primary Examiner — Hung T Nguyen
(74) Attorney, Agent, or Firm — LeonardPatel PC

(57) ABSTRACT

A service or maintenance device is provided by which the maintenance work to be done on air-conditioning systems is made easier. An internal measuring system for the evaluation and display of measured data may have a display control means configured to optionally show measured values in a dynamic analog scale type in parallel to a numerical value, and to allow a comparison with a set memory marking.

16 Claims, 13 Drawing Sheets

(51) Int. Cl.
  *G01L 19/08* (2006.01)
  *G08B 21/18* (2006.01)
  *G01D 7/04* (2006.01)

(52) U.S. Cl.
  CPC ....... *F25B 2700/19* (2013.01); *F25B 2700/21* (2013.01); *G01D 7/04* (2013.01)

(56) References Cited

U.S. PATENT DOCUMENTS

| | | | | |
|---|---|---|---|---|
| 7,234,313 B2* | 6/2007 | Bell | ................ | F24F 11/0086 236/51 |
| 7,851,758 B1* | 12/2010 | Scanlon | ................ | G01J 5/02 250/330 |
| 2006/0195043 A1* | 8/2006 | Rutherford | ............ | A61B 5/032 600/561 |
| 2008/0000254 A1* | 1/2008 | Bakker | ............ | B60H 1/00585 62/292 |
| 2008/0163629 A1* | 7/2008 | Chen | ................ | G01K 13/00 62/129 |
| 2010/0162822 A1* | 7/2010 | Ward | ................ | G01L 9/0029 73/733 |
| 2011/0066389 A1 | 3/2011 | Weick | | |
| 2011/0132018 A1 | 6/2011 | Chang | | |
| 2012/0240659 A1* | 9/2012 | Alfano | ................ | G01L 27/005 73/1.57 |
| 2012/0291457 A1* | 11/2012 | Brown | ................ | F25B 45/00 62/77 |

\* cited by examiner

SERVICE DEVICE FOR AIR-CONDITIONING SYSTEMS

CROSS REFERENCE TO RELATED APPLICATIONS

This application is a U.S. national stage application under 35 U.S.C. §371 of PCT Application No. PCT/EP2012/072996, filed on Nov. 19, 2012, which claims the benefit of German Application No. 10 2012 019 616.4, filed on Oct. 1, 2012, and German Application No. 20 2012 010 642.2, filed on Nov. 8, 2012. The subject matter of these earlier filed patent applications is hereby incorporated by reference in its entirety.

FIELD

The present invention generally relates to a service or maintenance device for air-conditioning systems (hereinafter a "service device"), and more particularly, to a service device by which the maintenance or service and start-up of air-conditioning systems, air-conditioning/refrigerating plants and heat pumps (hereinafter referred to as "air-conditioning systems") is made easier, with an internal measuring system allowing improved evaluation and display of measured data.

BACKGROUND

Air-conditioning systems basically consist of a circuit including two heat exchangers, a controlled expansion valve and a pump, the circuit being filled with a refrigerant. The gaseous refrigerant is compressed and condensed by the pump while releasing heat in a heat exchanger in the high-pressure part (HP) of the system. The refrigerant is expanded on the valve and absorbs heat when vaporization takes place in a heat exchanger in the low-pressure part (LP) of the system, thus cooling a medium contained therein. The vaporized refrigerant in the low-pressure part (LP) of the system is recirculated to the pump.

For filling or replenishing an air-conditioning system with a refrigerant, this system is routinely drained by a vacuum pump and, in this way, is also dehumidified. Afterwards, the air-conditioning system is filled, and the pressure in the high-pressure part (HP) and downstream of the expansion valve in the low-pressure part (LP) is set to specific values, depending on the vapor pressure temperature of the refrigerant used. The efficiency of the air-conditioning system depends, among other things, on this set of values (i.e., settings). For optimum configuration of the settings of an air-conditioning system, it is particularly important that a trend can be observed during the configuration, and that an alignment of values before/afterwards is possible so as to shorten the time required for optimally adjusting the system settings.

Installation aids or service devices are known for the maintenance and modification of the settings of air-conditioning systems. These consist of a valve block including valves and manometers (i.e., pressure gauges). Usually, the color of the ports, valves and manometers for the high-pressure part (HP) of the air-conditioning system is red, and the color of the ports, valves and manometers for its low-pressure part (LP) is blue.

Such installation aids also have a so-called service port, e.g., a valve for a vacuum pump or a refill bottle that is generally yellow. Also typically included is an inspection glass in which the refrigerant flow or the refrigerant state can be watched.

Further known are installation aids or service devices that do not have manometers, but instead an evaluation unit with a numerical digital display.

The fitter (installer) using these known installation aids does, however, have to be very experienced to be able to perform speedy and reliable maintenance of the air-conditioning system. Accordingly, an improved service device may be beneficial.

SUMMARY

Certain embodiments of the present invention may provide solutions to the problems and needs in the art that have not yet been fully identified, appreciated, or solved by current air-conditioner service devices. For example, some embodiments of the present invention provide an inexpensive service device by which the configuration of the settings and the filling of an air-conditioning system are facilitated by a measuring and controlling installation using the service device.

According to an embodiment of the present invention, a service device for air-conditioning systems includes an electronically controllable display and an associated display controller that are configured to show, on the display, successively determined measured values for at least one pressure registered by the service device in an analog representation that changes when the measured values change.

One of the advantages of some embodiments resides in the finding that human perception can recognize a rapid and/or progressive change in measured values in an analog type of display considerably more easily than a sequence of changing numbers of a digital display, particularly when these changes occur rapidly. In the solution according to some embodiments of the present invention, this progressive change is reflected by an analog representation on an electronically controllable display screen so that a qualitative information part, particularly whether the value rises or falls, is shown in a manner optimized for human perception.

The service device includes a valve block having ports, valves for the high-pressure part (HP) and valves for the low-pressure part (LP) of the air-conditioning system. Furthermore, an electronic evaluation unit is included to which two internal pressure sensors are connected, said sensors being able to detect the pressure in the high-pressure part (HP) and the low-pressure part (LP). Along with the high-pressure part and the low-pressure part, temperature probes connectable to the evaluation unit are provided.

The evaluation unit is configured to calculate the pressure values depending on the temperature in the respective part of the system while taking the physical parameters of a respective refrigerant into consideration. The refrigerant may preferably be selected via a menu by means of keys on the device. A display controller converts the measured values into suitable control data, by which the digital and analog graphic display is controlled. Thus, during the service or maintenance procedure, or during the filling, the user can be shown the respective data in real time digitally (in numerical representation) as well as in analog (in graphical representation). Preferably, actual values with respect to target values and progressions are displayed graphically.

In the analog type of display, changes in the measured values can be recognized considerably more easily. The quantitative assignment of the values, i.e., the reading of a measured value, requires some diligence when making an assignment from pointer to scale. This assignment may involve a certain lack of precision. Compared thereto, a measured value indication in the form of numbers does not necessitate any assignment between pointer and scale; in general, it allows for more precision. Preferably, the service device can represent the measured value(s) in both types of display simultaneously or in parallel, so that the maintenance work is facilitated more easily by the improved type of display.

Preferably, the user can recall stored values, or can set memory markings at, e.g., pointer positions, which he or she can subsequently compare in relation to the stored/actual values. When the measured values are represented in this manner, the maintenance technician can immediately readjust the service values, filling values, pressure adjustment values, temperature values or vacuum values.

In various embodiments of the service device, the shape and the type of the display can vary. For instance, a screen can be arranged as a display behind a cover having inspection cut-outs and allowing a view of the screen sections to be exposed in the inspection cut-outs. By this arrangement, the measurement indications can be distributed to evidently individual instruments, which a person will perceive as being more clearly arranged.

The screen for forming the display can be directly embedded into the plastic material when a housing front for the service device is made of plastic. In this way, the screen is incorporated in the housing front in a sealing manner. The display can also be aligned in a way relative to the main plane of the housing and inclined towards the observer, so that the readability of the display is improved when the service device is in an operating position. The display may also be pivotable and/or designed as display unit detachable from the service device and independently operable, as the case may be. The display may have a data storage function and a machine-readable data communication capability.

In the below description, the representation of a value as electronic numerical representation of a value is designated as "digital" representation, and the graphical representation of a value is designated as "analog" representation, this being outputted via particularly a pointer or bar or in another graphical way via the electronically controlled display of the device. Here, as graphical elements, e.g. graphical forms and segments are switched on and off on the display, or graphical elements are generated from several pixels on a dot-matrix display.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which:

FIG. 9 shows the display of an embodiment of the present invention during the filling of an air-conditioning system with refrigerant R134a;

DETAILED DESCRIPTION OF THE EMBODIMENTS

Some embodiments of the present invention pertain to a service device that provides for easier maintenance of air-conditioning systems. An internal measuring system for the evaluation and display of measured data includes a display controller. The display controller is configured to optionally show measured values in a dynamic analog scale type in parallel to a numerical value, and to allow a comparison with a set memory marking.

Figure 1:
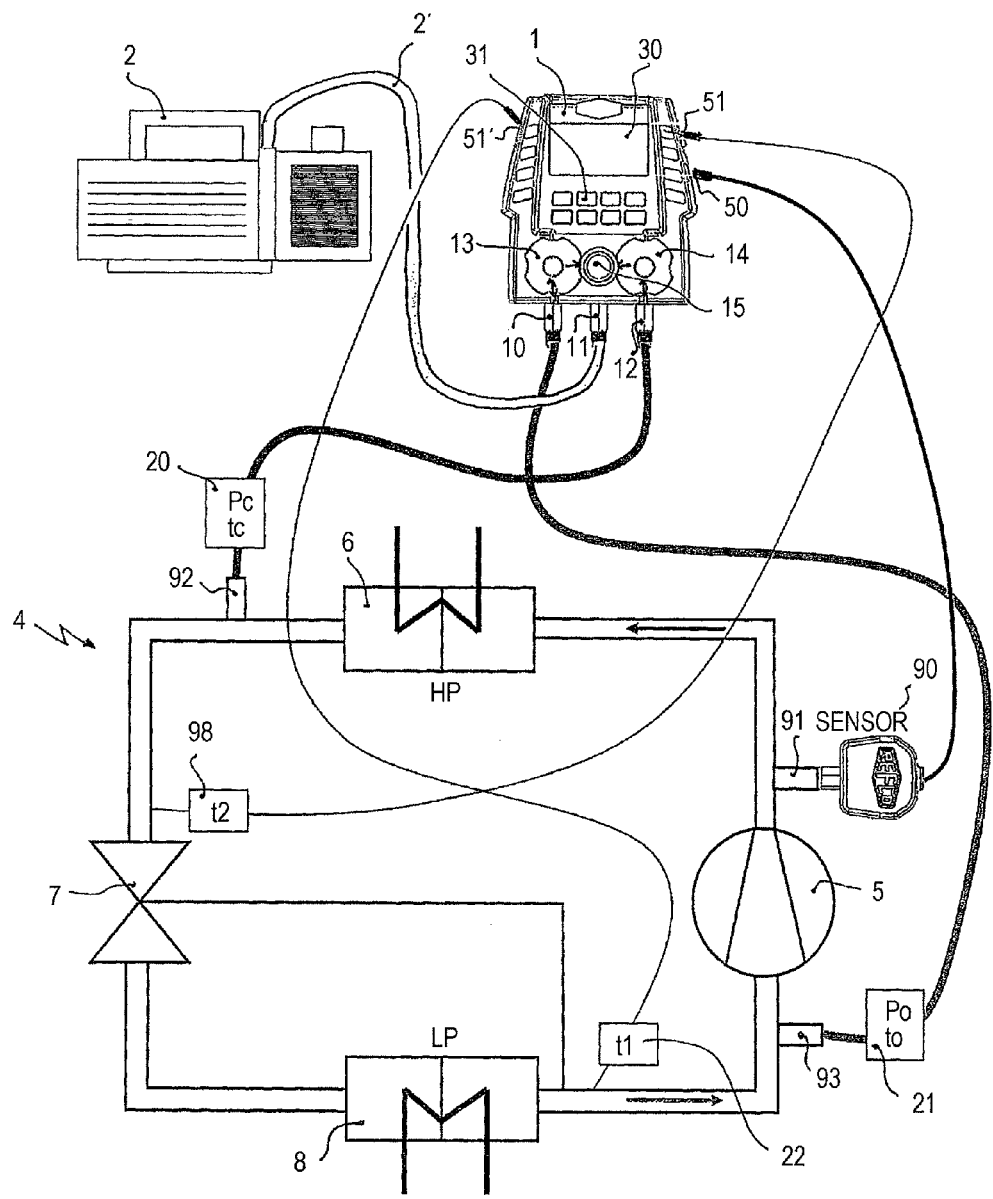
FIG. 1 is a schematic diagram showing a service device according to an embodiment of the present invention, connected to an air-conditioning system to be serviced.

FIG. 1 shows a schematic diagram that shows a 2-way type of a service device 1, which is connected to a vacuum pump 2 and to an air-conditioning device 4 by tubes. The air-conditioning system has a compressor 5 that pumps the refrigerant in the direction of a heat exchanger 6 in the high-pressure part HP. Between the compressor 5 and the heat exchanger 6 of the high-pressure part, a vacuum sensor 90 is provided at a first service port 91 in the high-pressure part of the air-conditioning system and is connected to a port 50 of the service device 1.

Downstream of the heat exchanger 6, a filling coupling 92 is connected to a port 12 of the service device 1. The service device 1 determines the pressure $P_c$ prevailing at the pressure-measuring point 20 by an internally installed pressure sensor (not shown), and accordingly determines a target temperature $t_c$ from deposited refrigerant values and outputs the target temperature on a display 30. A first temperature sensor 98 mounted in the high-pressure part is connected to a port 51 of the service device 1. The measured temperature $t_2$ in the high-pressure range HP is optionally also shown on the display 30 of the service device 1 for comparison with the target temperature $t_c$. The refrigerant is expanded in the system via a controlled expansion valve 7 and then enters into a heat exchanger 8 in the low-pressure part LP, where the refrigerant evaporates while absorbing heat from the environment to be cooled. A second temperature sensor 22 downstream of said heat exchanger 8 is connected to a port 51' of the service device 1.

A coupling 93 is connected to a pressure port 10 of the service device via a tube. The pressure $p_o$ prevailing at this point in the low-pressure range LP is determined by a second pressure sensor within the service device 1, and is displayed and outputted on the display 30 with a respective, theoretical temperature value as a target value. The actual value $t_1$ determined by the second temperature sensor 22 is constantly updated in a measurement cycle as reference value with respect to $t_0$, and is also outputted to the user by means of the display 30. When there is a refilling or when the refrigerant is drained in a service procedure, the vacuum pump 2 is connected to the port 11 of the service device by means of a tube 2'. Then, the valves 13 and 14 are opened, and the air-conditioning system or plant is evacuated. By means of the keys 31, various values (e.g., pressure, vacuum, temperatures, etc.) can be set, stored or determined via the display 30 on the service device, thereby adjusting the system in an optimum manner.

Figure 2:
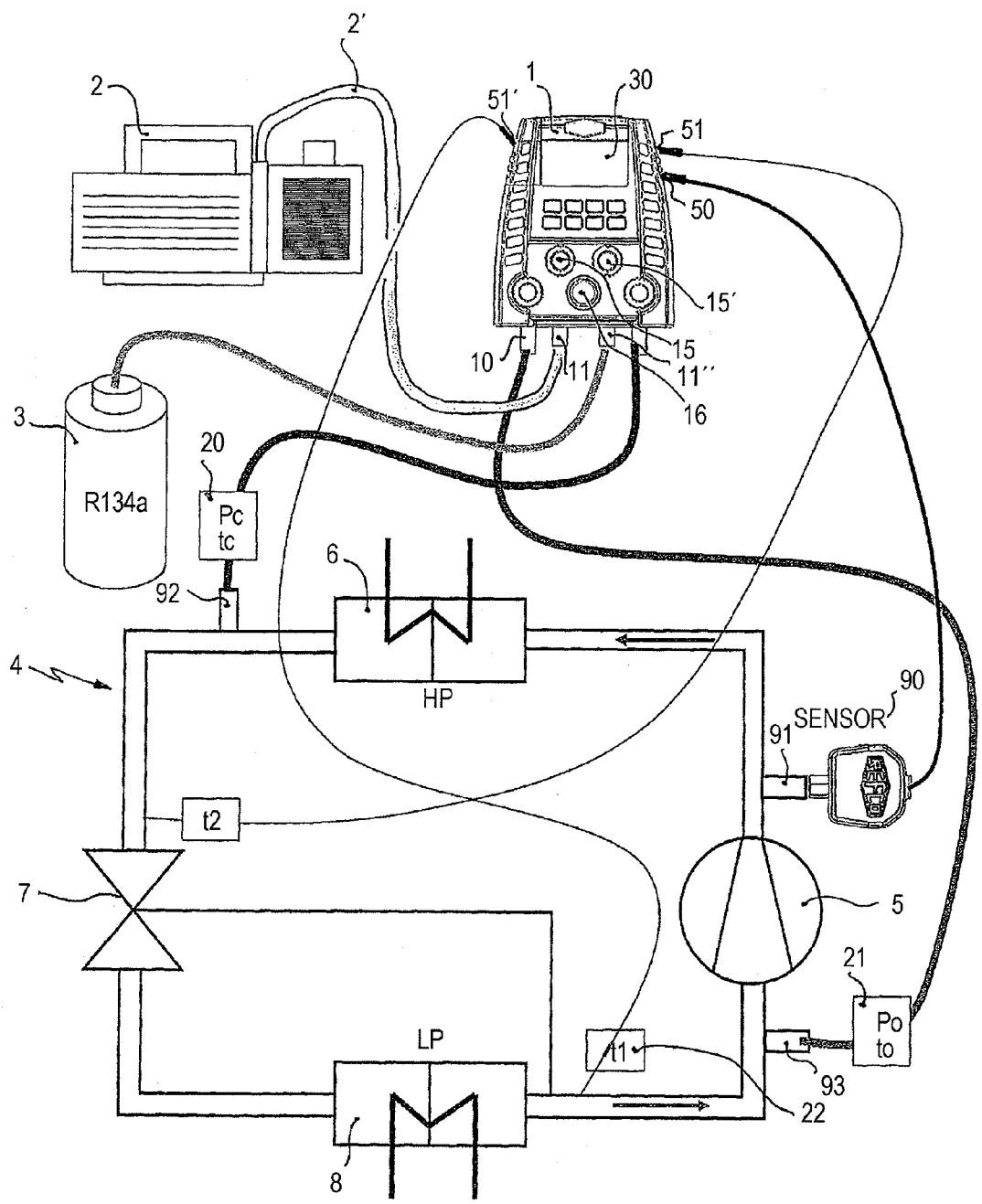
FIG. 2 is a schematic diagram showing a service device according to another embodiment of the present invention, connected to an air-conditioning system.

FIG. 2 shows a further schematic diagram of the service device 1 in a further embodiment, wherein, via an additional port 11", a storage bottle 3 can be connected to the service device 1 and additionally to the vacuum pump 2. In this way, it is possible to fill the air-conditioning device directly and without switching of the tubes with the vacuum pump 2 being connected. For this purpose, two further gate valves 15 and 15' are mounted to the service device 1, by which the respectively necessary connections between the air-conditioning system, the storage bottle and the vacuum pump can be established.

Figure 3:
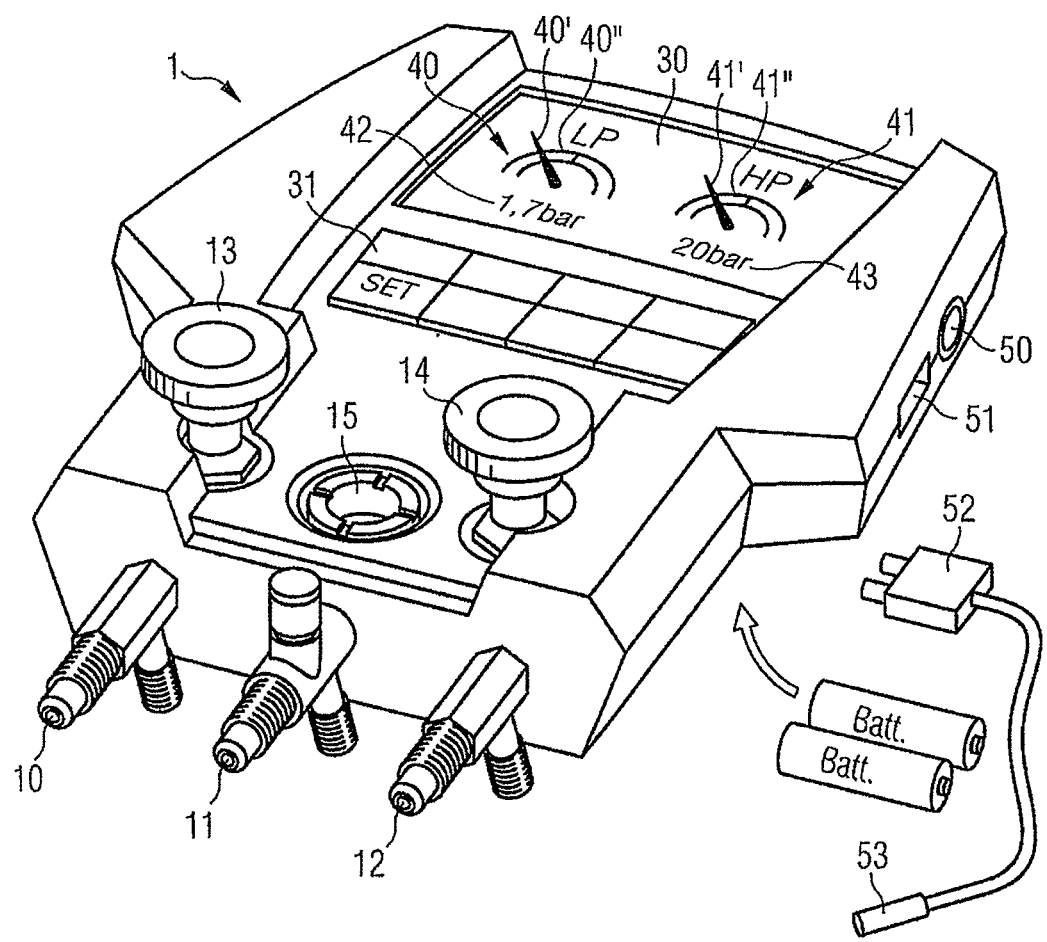
FIG. 3 shows a perspective view of a 2-way type of the service device from FIG. 1.

FIG. 3 shows a perspective view of the 2-way type of the service device, as used in FIG. 1. Pressure values for the HP and LP ranges can be displayed in analog as a virtual pointer instrument 40, 41, and also as a digital value 42, 43. This is advantageous, e.g., when filling the system. For filling the system, the storage bottle is connected to the air-conditioning system via the service device. Refrigerant is sucked in by switching on the compressor 5 of the air-conditioning system 4, and the system is filled therewith. The pressure rises in the circuit of the air-conditioning system 4 and is displayed as pointer value 41' on a scale in a virtual pointer instrument 41 and, in parallel thereto, as a pertinent digital or numerical value 43. By pressing a key, e.g., the SET key, a position of the pointer can be stored or marked in accordance with a measured value by a marking, e.g., in the form of a line 41" being generated on the scale of the virtual pointer instrument 41.

Also, the user can watch the filling operation and the pressure increase by means of the pointer. It turns out that a person can better perceive dynamic progressions by means of pointer movements than by means of changing numbers. The jerky, slow or rapid movement of the pointer makes it easier to follow progressions than via changing numbers. In the case of the service device, the pointer movement can here be used to manually set the valves rapidly or slowly, adapted to the configuration of the settings. Furthermore, after completion of the filling operation, it is easier for the user to watch any pressure loss that might occur and might suggest a leakage by monitoring whether the pressure value changes to the memory marking over a trial time. The speed of the pointer movement allows a rapid conclusion with respect to position and size of the leakage without having to watch the exact absolute values.

Figure 4A:
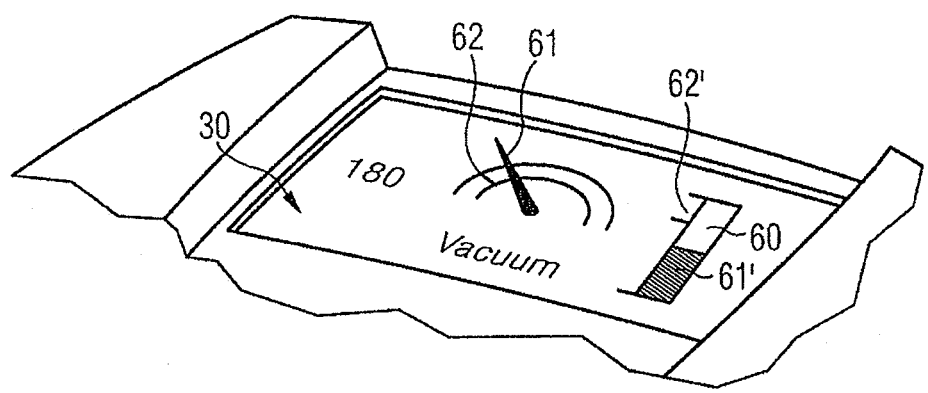
FIG. 4A shows a perspective view of the display of the service device during a vacuum measurement.

FIG. 4A shows a perspective view of the display 30 during a vacuum measurement, e.g., while the vacuum pump completely drains a circuit of an air-conditioning system. In the shown example, the display 30 automatically changes to a pointer indication 61 in addition to the numerical representation when the vacuum sensor is connected. The value determined via the vacuum sensor can thus be displayed digitally and in analog in parallel, i.e., as numerical value and as pointer representation.

In this way, the user can watch during the operation how the quality or the amount of the vacuum changes. The development of the value can be watched particularly well over the time in parallel to a digital value by means of the pointer movement of the pointer 61 on a scale. In particular, during the draining process, a memory marking 62 on the display 30 can be set by means of a keystroke, e.g., in accordance with a current pointer position. Then, the further development of the vacuum can be observed. Especially, however, it can be seen very easily even after the vacuum pump is switched off whether the vacuum value of the system can be maintained, whether a loss occurs, or whether the system shows a leakage, as the change of the pointer position 61 with respect to the memory marking 62 can be quickly recognized. The graphic display can be realized in that a pointer 61 moves over a scale in a rotating manner; alternatively, according to the display 60, the development of the value can be shown with respect to a scale via a changing bar 61'.

In particular, it is automatically detected in the service device in some embodiments whether an external vacuum sensor is connected. In the example shown here, the display changes, for instance, to the bar representation if no external vacuum sensor is connected. If, with a vacuum sensor being connected, a change to the bar display nevertheless takes place, this may, e.g., be used for error detection. The change of the display type may also serve as a reminder to check the mounting of a vacuum sensor. If an external vacuum sensor is connected, the value transmitted for the vacuum is indicated as digital value and as exact graphical value. If no external vacuum sensor is connected, the device switches to one of the internal pressure sensors and uses this sensor, and graphically outputs the measured value, e.g., as an indication value only.

The graphic display of measured values is, however, not limited to these representations. The measured values can also be shown in another way, e.g., as segment of a circle, curves, stepped diagram, bar diagram, etc. In addition, in some embodiments, it is possible to store the values in the device and to transmit them, e.g., via a Universal Serial Bus (USB) interface, to a computer for preparing a plant or test certificate.

Figure 4B:
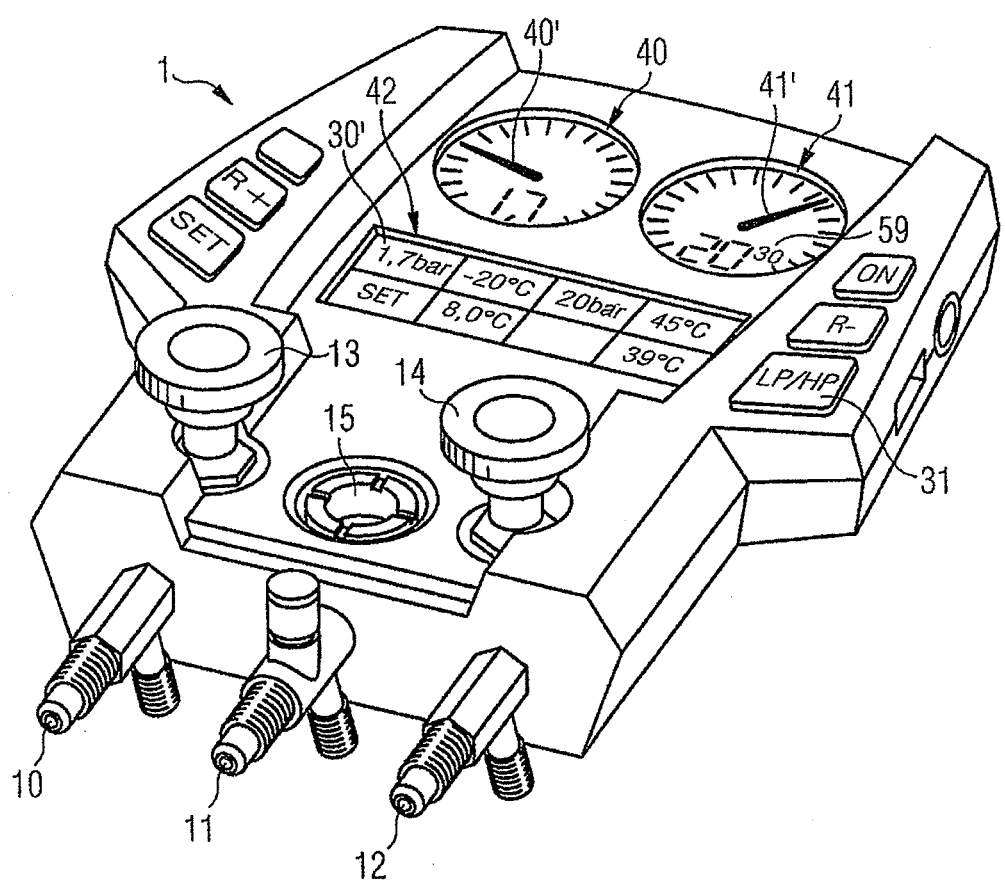
FIG. 4B shows a perspective view of a further embodiment of the service device having round displays.

FIG. 4B shows a perspective view of a further embodiment of the service device having circular displays 40 and 41. The circular displays 40, 41 are separately embedded in the housing. Preferably, rings or frames around the display or the background of the display are designed in red and blue, and the color design is assigned to the respective HP or LP pressure range.

The conventional appearance shows that the respective pressure value essential for the correct filling of the air-conditioning system can be perceived very easily in its dynamic behavior as pointer movement of the virtual pointers 40' and 41', thus clearly showing the processes in the circuit of an air-conditioning system to the user. An orientation for this is a final value 59 shown on the display, which can be re-calculated by means of the specifications, or can be retrieved from a memory. Additionally, the current numerical value can be displayed digitally in the middle of the lower range of the circular display.

It is further possible in some embodiments to also output the pressure values and other values or indications digitally as a numerical display in a separate display field 30' below the circular displays, such as target and actual temperature values, or the refrigerant selected. It is also possible, in particular, that the individual display fields are sections of one single display arranged under the front cover of the service device. Cut-outs in the front cover open the view to the respective display fields, giving rise to the impression of two or three separate measuring instruments or measured value displays. This solution is relatively inexpensive as the contents of the individual display fields are generated by the common display control electronically.

As can be seen from FIG. 4B, operating keys 31 are positioned at the outer edge and on both sides of the display 30. In this way, the service device can be held and operated at the same time.

Figure 4C:
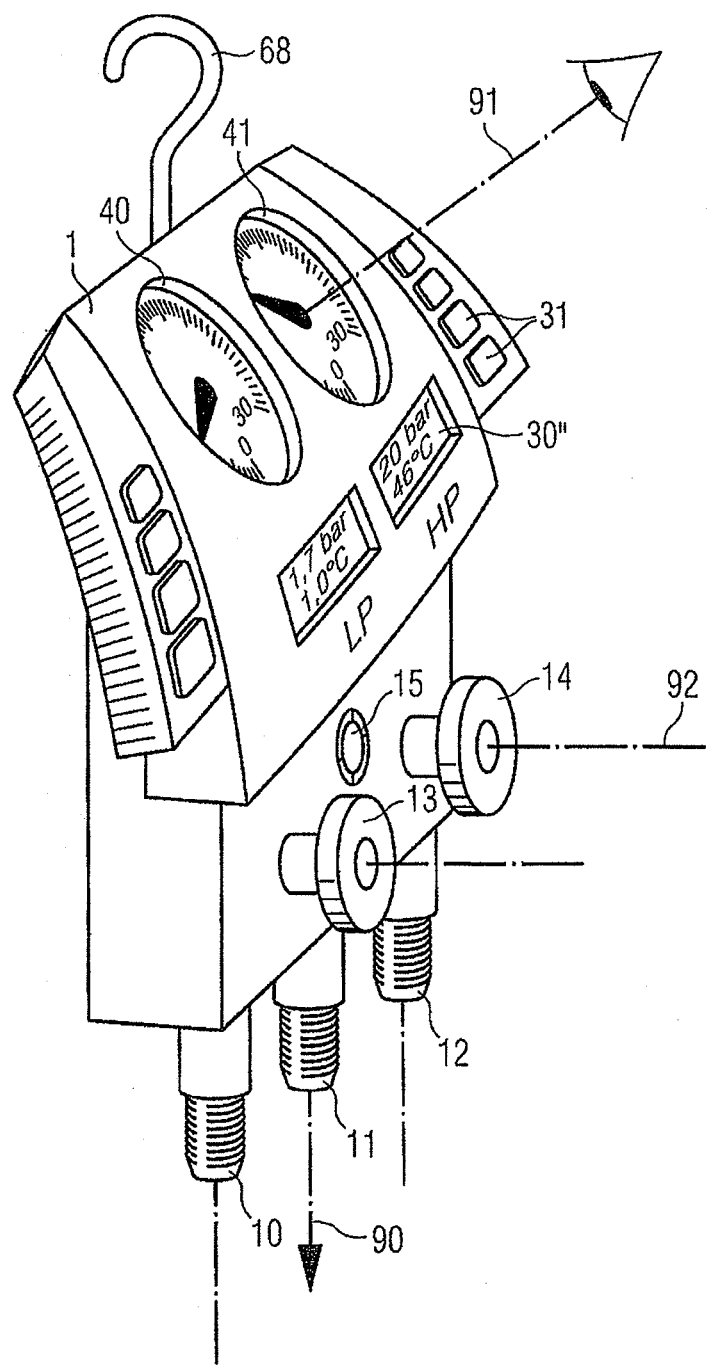
FIG. 4C shows a perspective view of a further embodiment of the service device, in which a viewing angle of the display is designed so as to be inclined to a user.

FIG. 4C shows a perspective view of a further embodiment of the service device 1. Here, the viewing angle of the display fields 40 and 41 is inclined towards a user. The perpendicular to the display surface forms a viewing axis 91. The viewing axis 91 is inclined with respect to the array of the lower pressure ports 10, 11 and 12, which are arranged on or in parallel to a symmetrical axis 90 of the housing. In particular, the inclination angle has a value of between 20° and 70°, 30° and 60°, 40° and 50°, etc.

In other words, the axes of the pressure ports 10, 11, 12, or also 11', as the case may be, are preferably located in a common plane. The main plane of the display is a plane inclined vis-à-vis this common plane. The angle of inclination lies within the area of the aforementioned angle. If the service device 1 is suspended by the hook 68 so that the user's hands are free, the display 30, 40, 41, 30" provided in an inclined manner normally makes it easier to watch the displayed values. The rotational axes 92 of the adjusting knobs for the valves 13 and 14 and the main viewing direction of an inspection glass 15 are basically aligned in parallel to each other and are preferably perpendicular to the common plane of the pressure ports. A special sealing of the service device 1 against environmental impacts, rain or spray water is achieved in that one or more inspection cut-outs, which allow the view of the display fields, are pre-manufactured and are then completed by insert-molding in a plastic injection molding machine together with the front of the housing or parts thereof such that they are embedded into the plastic material. In this way, the housing and the inspection glass are connected in a particularly tight manner.

Figure 4D:
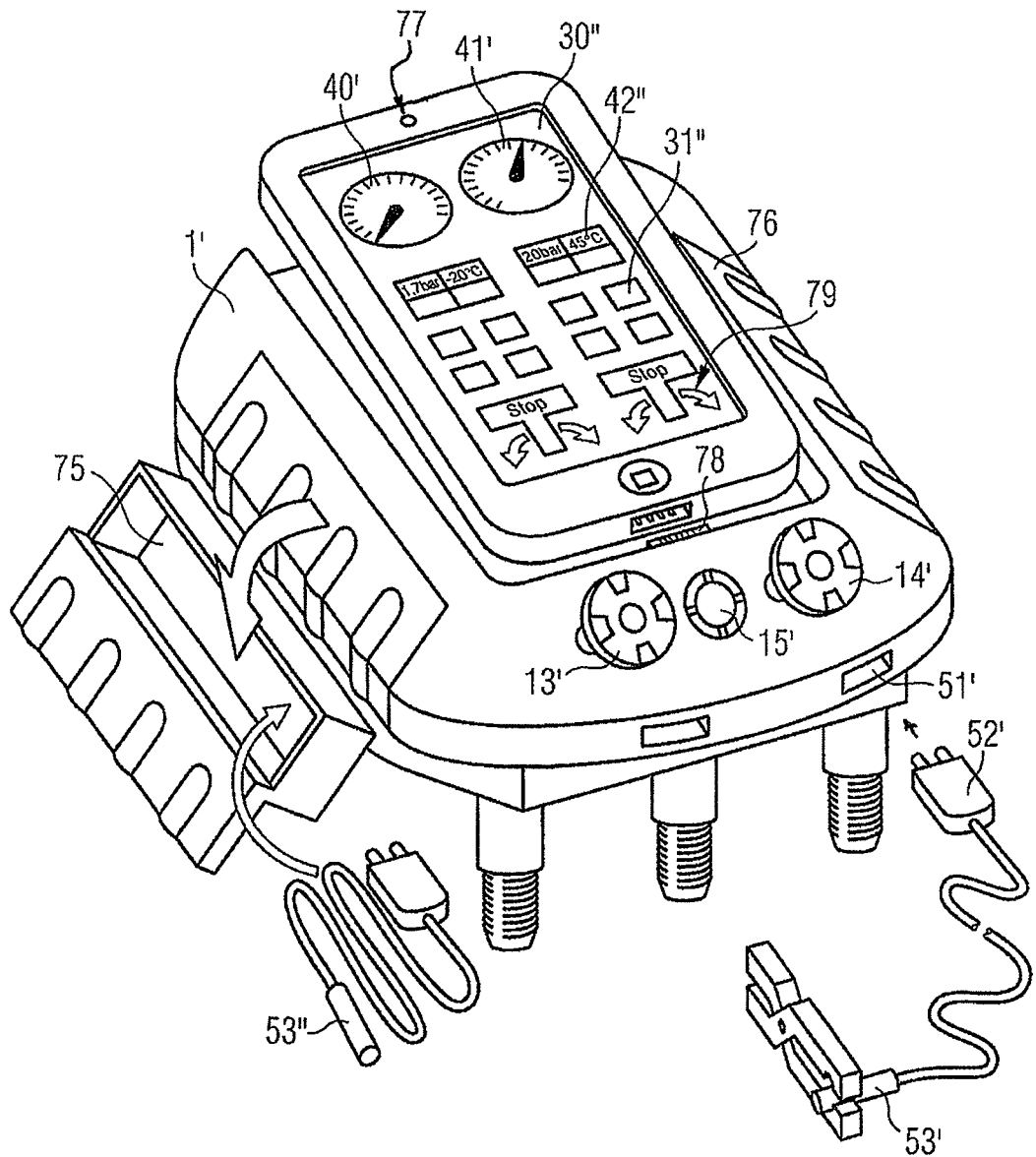
FIG. 4D shows a perspective view of a further embodiment of the service device having a detachable display unit.

FIG. 4D shows a perspective view of a further embodiment of the service device 1. Here, the display 30" as part of an intelligent display unit is configured to be detachable from a base unit of the service device having the sensors, the valve unit, etc., and the display 30" can be removed. At the same time, the display 30" of the display unit is designed as a touch-sensitive screen and the display unit is advantageously equipped with further functions. A circuit board having a processor is provided under the display, said board being connected to the display controller and, furthermore, to the display.

The intelligent display unit may have a radio interface with the base unit 1', which may also be equipped with a radio interface and can transmit sensor data to the display unit. The detachable display unit is particularly advantageous in that the user may change place when the air-conditioning systems are rather large, and may carry out changes on other parts of the system as well. At the same time, the user may watch pressure and temperature changes in the system, detected by the base unit 1'.

The data is, e.g., transmitted via the Bluetooth™ standard or another radio standard. As an alternative or in addition, optical transmission paths may be provided as well, and the display unit and the base unit 1' have optical interfaces adapted for this.

On the display of the display unit, preferably, the two LP/HP pressure values are graphically shown as analog pointer values 40' and 41'. Other values, such as temperature values, can also be shown in analog as a graphical value, e.g., as a bar, but may also be represented as a digital numerical value 42", preferably in blocks.

Furthermore, the display 30" of the display unit has touch-sensitive areas, which are graphically highlighted such that they are perceived as keys. By means of these keys, the user can call up and change various functions.

Additionally, by a camera 77 integrated in the display unit, values or bar codes at an air-conditioning system can be read in. In this way, protocols, refrigerants or other information or settings assigned to a system can be called up.

In particular, however, the display unit may also be designed as a cellular phone or tablet computer or miniature tablet computer. This may, e.g., be Apple's iPad Mini™, a Samsung™ tablet PC or a cellular phone having internet functionality.

An intelligent display unit (equipped with computer functions) may enable an expert-system-like program to be operated on this display unit, which is adapted to output recommendations of action to the user in response to the measured values that are transmitted and evaluated. It is, for instance, possible that symbols 79 are assigned to the valves 13 and 14 on the display. These symbols can request that a valve 13, 14 be opened or closed until a specific value or pressure is reached. In this way, even service technicians who are not specifically trained may have access to characteristics that have been established and stored by experts for a respective system configuration.

Thus, every service technician may receive the same repeatable commands for the optimum setting of the respective air-conditioning system. For instance, the measured values of pressure and temperature can be received wirelessly or via a plug interface 78 from the sensors from the base unit. Preferably, the display unit sends the measured data wirelessly to a server, gets back target values calculated in accordance with refrigerant and actual values, and the measures to be taken by the user are shown in the form of illuminated symbols 79 on the display of the display unit.

It makes sense that, when the display unit is plugged in, the symbols per valve controllers 13' and 14' are provided above the controllers and basically consist in arrows indicating the rotational direction and a stop symbol. Likewise, it is possible that other symbols and recommendations for action are activated and displayed on the display. A command and information output in text and language is possible, this being adjustable depending on the nationality. It is also possible that this occurs simultaneously so that, e.g., the arrow in the rotational direction lights up for HP and, simultaneously, a language output of "slowly open red rotary valve HP by rotation counterclockwise" is provided. Likewise, it is possible that film sequences or animations are played on the screen with respect to various points, or are retrievable in a help menu. The removable display unit can consist of a simple dot matrix display, which is controlled by keys that are arranged around the display or below the display.

According to FIG. 4D, sockets 51' for plugs 52' of temperature sensors 53' for the LP and HP ranges are arranged on the edge of the base unit and below the control knobs for the valves 13, 14. Furthermore, handle areas 76 are attached to the base unit. These handle areas 76 are designed as a stowage compartment 75 and can be opened for receiving, e.g., a temperature sensor 53".

Preferably, a seat for the display unit in the base unit is designed such that the main plane of the display of the display unit is pivoted in the direction of the viewer. The seat for the display unit can also be adjustably pivotable (e.g., by a ball joint or the like, which may be lockable, if required), so that the viewer can adjust the display in accordance with the respective situation, for an easier reading of the display values.

Figure 5:
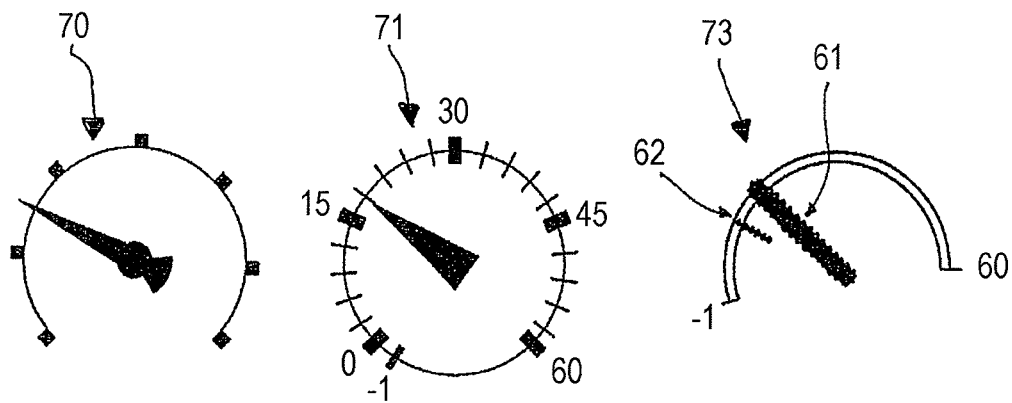
FIG. 5 shows examples of various types of representation of a graphic display on the display of the service device of FIG. 1.

FIG. 5 shows several representation types of a graphical display on the display 30 of the service device 1, said display 30 being in the form of circular segments 70 or a full-circle scale 71 or a semi-circle/partial-circle scale 73. Depending on the resolution of the display, the representation of a pointer 61 or a marking 62 is composed of small squares.

Figure 6:
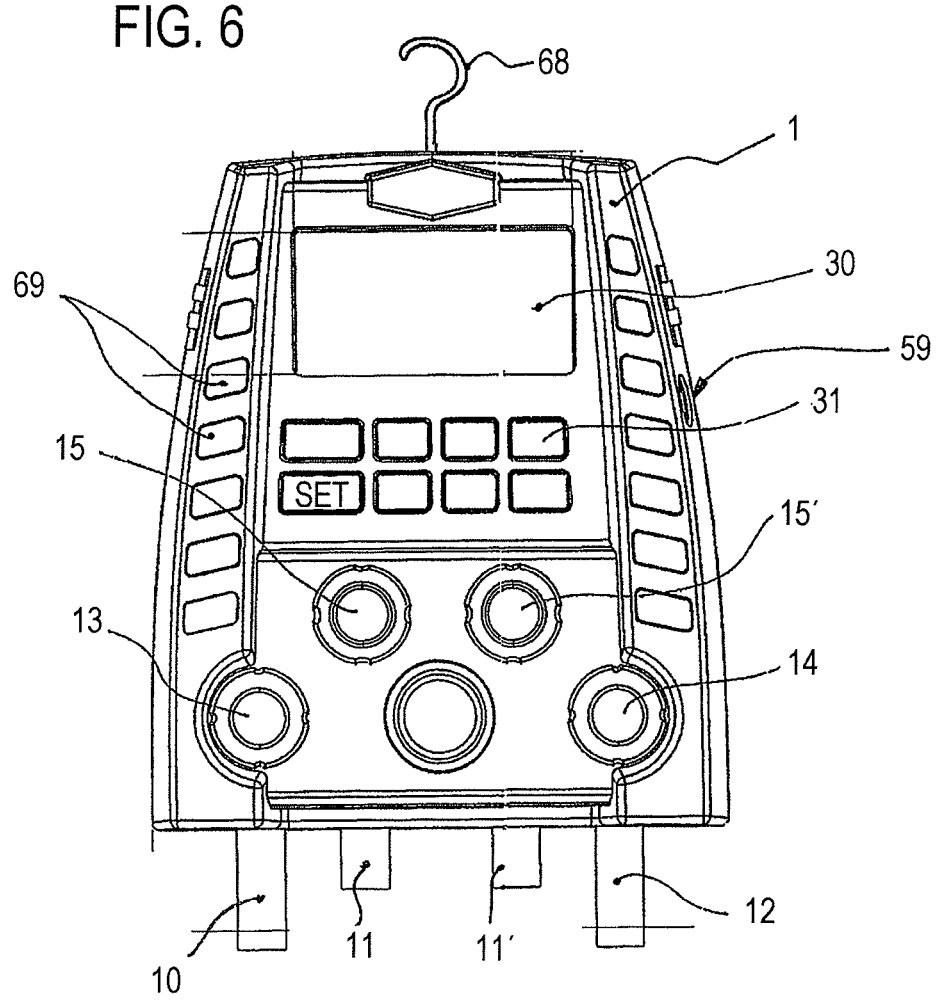
FIG. 6 shows a top view of a further embodiment of the service device.

FIG. 6 shows a top view of the service device 1, this drawing being the representation of a 4-way type of the device including four valves. Such a design has already been described with reference to FIG. 2. Here, additional gripping surfaces 69 are provided, and a suspension eye 68 that can be folded out is shown.

Figure 7:
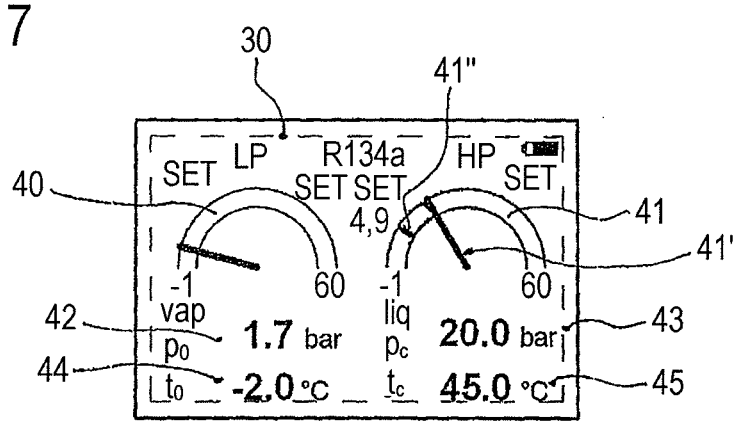
FIG. 7 shows an embodiment of the invention, with, e.g., the refrigerant R134a being shown on the display as selected.

FIG. 7 shows an embodiment of the present invention, with the refrigerant R134*a* being selected on the display 30 and the service device being set to this refrigerant. The pressure value is shown digitally as numerical value 42, 43 and as an analog pointer value 40, 41'. The user has the advantage that the pressure value—e.g., as marking 41" with the pertinently shown "SET value" (here: 4.9)—can be stored via keystroke and, thus, the further dynamic development of the actual measured value can be watched by the pointer 41' compared to the marking 41", and measures for reaching a target value in the LP and HP range regarding an optimum pressure can be introduced in a dynamically adapted manner.

Figure 8:
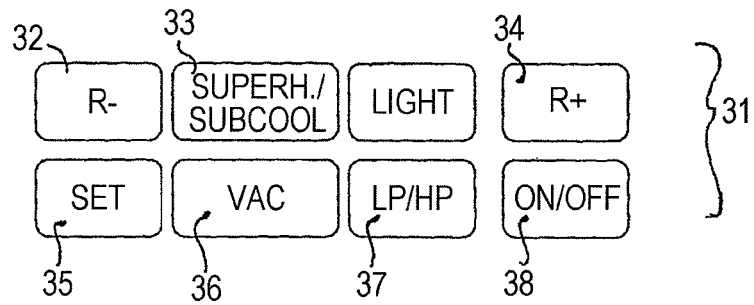
FIG. 8 shows the operating elements in an embodiment of the service device.

FIG. 8 shows the operating elements in an embodiment of the service device 1 having eight keys. The keys are:
keys 32 and 34 for the selection of the refrigerant;
key 33 for changing into the super-heat and the sub-cool mode, the temperatures being adjusted via the pressure in the system, the external temperature sensors being required for this function;
key "LIGHT" for switching on the display illumination whose light is preferably distributed onto the display via reflection at the outer edges and the cover;
key 35 for storing selected units and refrigerants;
key 36 for changing to the vacuum mode with a vacuum display;
key 37 for changing into the pressure mode. When the key 37 is pressed once, the digital (numerical) display appears. When key 37 is pressed again, digital and analog values are shown in parallel;
key 38=ON/OFF;
key combination 35 and 37: selection of the pressure unit in the pressure mode;
key combination 35 and 32: selection of the temperature unit; and
key combination 35 and 36: selection of the vacuum unit in the vacuum mode.

Figure 9:
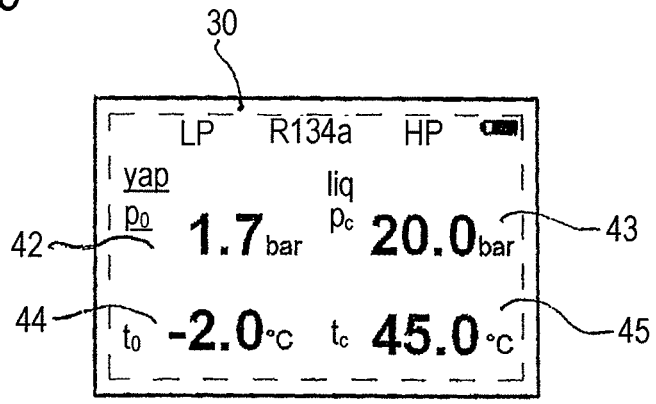

FIG. 9 shows an embodiment of the present invention during the filling of the air-conditioning system with refrigerant R134a. On the display 30, the values can only be seen digitally as a numerical value in conventional systems. When the key "LP/HP" is pressed once again, the analog display is additionally visible in parallel to the digital display.

Figure 10A:
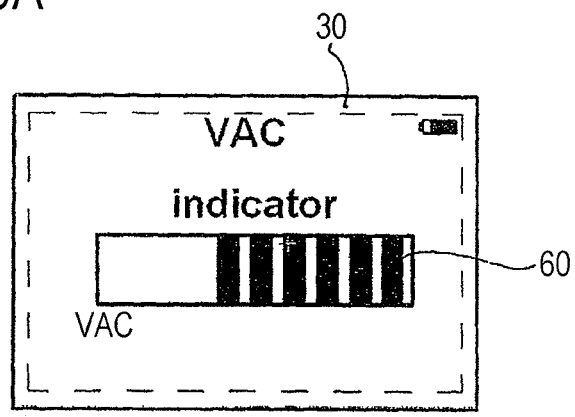
FIG. 10A shows an embodiment of the display 30 during the evacuation of an air-conditioning system with the vacuum pump.

FIG. 10A shows an embodiment of the display 30 during the evacuation of a system by the vacuum pump. This is only a qualitative display 60 without value assignment unless an external vacuum sensor is connected.

Figure 10B:
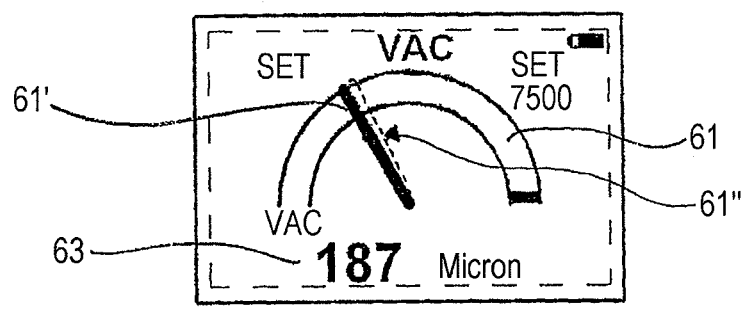
FIG. 10B shows a parallel display of an analog, graphically represented pointer value and of the corresponding digital value.
Figure 10C:
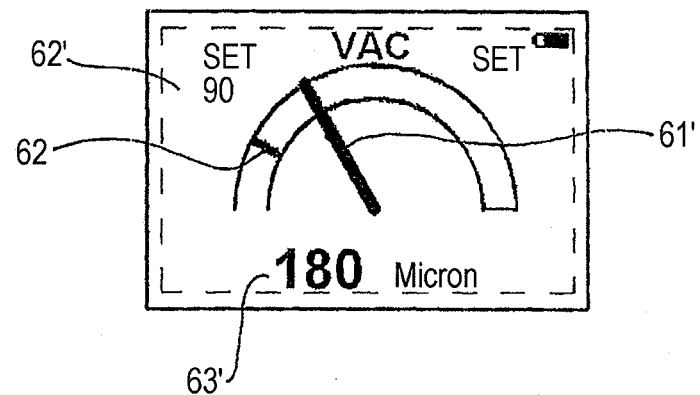
FIG. 10C shows the same display as FIG. 10B, plus a stored value which is also displayed as "set value" in the display area.

FIG. 10B shows a parallel display of an analog, graphical pointer value 61' and of a digital value 63. For this, in one embodiment, the external vacuum sensor 90 of FIG. 1 e.g. has to be connected to the vacuum port 50 of FIG. 1. When an actual value is stored, a value respectively stored in the respective scale range is displayed as "SET value" above the scale 61 as corresponding numerical value (here, 7,500 microns). In particular, when there is little change, a tendency of the measured value or a currently active measurement can be displayed in that a part of the pointer 61" is shown to flash, or that the pointer changes its position by a small amount, flashing in the trend direction of the display in a specific rhythm. FIG. 10C shows the same display as FIG. 10B, plus a stored value 62, which is also outputted in the display area as "SET value" (here: 90).

Figure 11A:
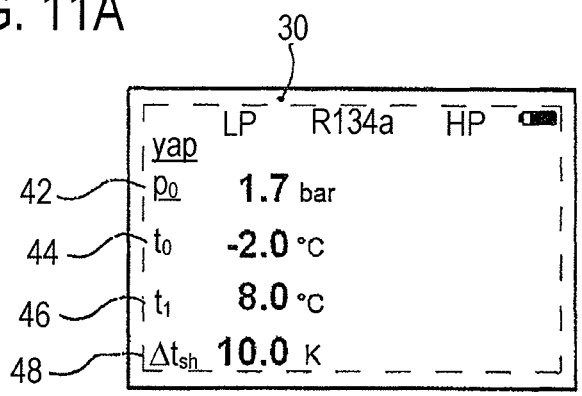
FIGS. 11A-C show an embodiment with exemplary representations on the display during the filling of a system.
Figure 11B:
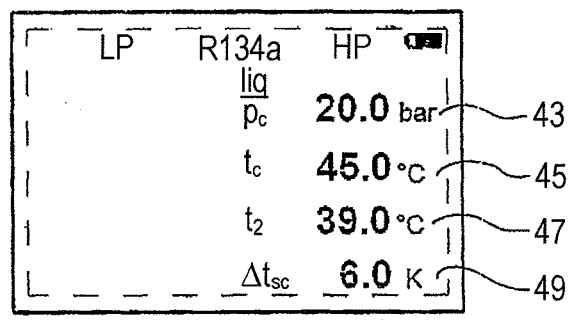
Figure 11C:
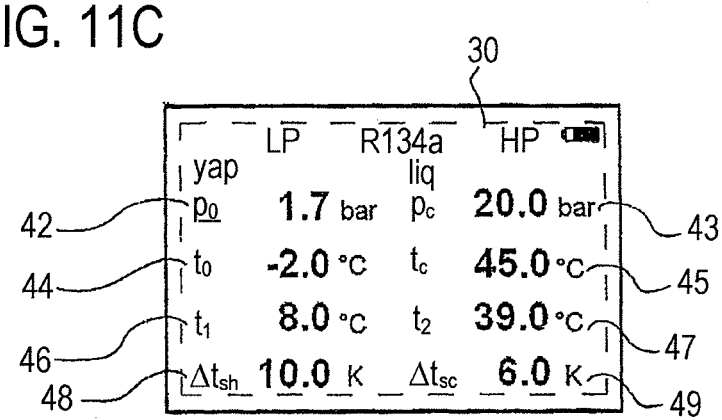

FIGS. 11A-C show an embodiment of the display 30 during the filling of a system. FIG. 11A shows system values of an air-conditioning system on the display, the example showing the refrigerant R134a. On the low-pressure side "LP" (Low Pressure), when the temperature sensor is connected in the LP area, or in the suction area of the pump after connection of the sensor, there appears:
$p_0$ 42=pressure measured at sensor 10 in FIG. 1 when being connected to coupling 93 in FIG. 1;
$t_0$ 44=temperature calculated via pressure (vap=vaporized);
$t_1$ 46=temperature measured at tube point 22 of FIG. 1, by temperature probe connected to service device at 51'; and
$\Delta t_{sh}$ 48=the difference calculated between $t_0$ and $t_1$.

FIG. 11B shows system values on the display on the high-pressure side (HP) of the air-conditioning system, the example showing the refrigerant R134a. These values appear when the temperature sensor gets connected to the service device in the "HP" area (High Pressure), here, upstream of the expansion valve of the air-conditioning system:
$p_c$ 43=pressure measured at sensor 12 in FIG. 1 when being connected to coupling 92 in FIG. 1;
$t_c$ 45=temperature calculated via pressure (liq=liquid)
$t_2$ 47=temperature measured at tube point 98 in FIG. 1 by a temperature probe connected to the service device at 51'; and
$\Delta t_{sc}$ 49=the difference calculated between $t_c$ and $t_2$.

FIG. 11C shows the values from FIGS. 11A and 11B together on one display. For this, both temperature probes in the LP and HP ranges have to be connected. Via the A values 48 and 49, the efficiency of the system can be influenced and optimized. Then, the efficiency of the system can be set via the pressure settings of the system. Here, the mode with the graphical, analog display may be selected anytime so as to watch changes of a dynamic and qualitative nature on the graphical display over time (cf. key 37 of FIG. 7).

Figure 12A:
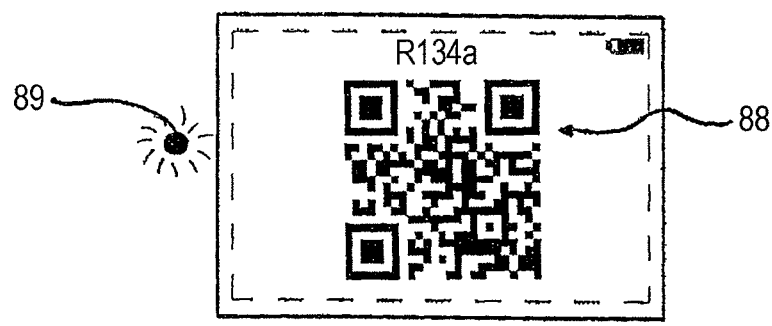
FIG. 12A shows an optional function of the display, which is controlled for outputting data which are outputted by means of a machine-readable code and/or a flashing lamp or LED.

FIG. 12A shows an optional operational mode of the display for outputting data and information by means of a machine-readable code or a flashing lamp or LED. These can be represented, for example, in the form of a QR code 88, can be guided to an internet database server via a link, and can be transmitted to a mobile terminal together with information concerning refrigerants, regulations, safety data sheets or instructions for operating an air-conditioning system.

The recorded measured values of the service device 1 can be transmitted to a CCD camera or a mobile terminal by an LED 89. Accordingly, on the site of an air-conditioning system, test reports and protocols can, e.g., be drawn up and dispatched easily and quickly by a tablet PC or a portable computer or cellular phone. Likewise, by these means, a transmission of measured values for a qualified computer-supported remote diagnosis is possible.

The data can be sent for evaluation to the mobile receiving apparatus by means of imaging a machine-readable code on the dot-matrix display of the display 30, by means of a QR code on the device or on the display or via the flash frequency of a lamp or LED, or also by means of a flashing display segment. The display for showing the measured values can, e.g., be designed as matrix-controlled LCD, OLED, TFT screen, plasma screen or the like. Individual pixels can be shown, so that numerals and pointers or bars as well as texts or scales can be shown by a combination of the displayed pixels. The pixels are assigned and controlled on the display by the display controller.

Figure 12B:
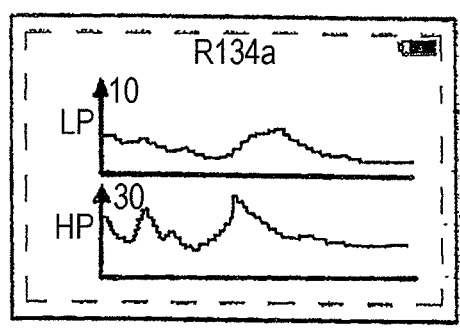
FIG. 12B shows an optional function of the display, which is controlled for displaying data in a curve shape.

FIG. 12B shows a further optional operational mode of the display for outputting data and information, e.g., the pressure in the LP and/or HP range plotted as curve over time. Also, a data recording or data logger function can be linked to this function for storing the measured values in a memory of the service device in order to evaluate these subsequently on the service device itself or on other apparatuses after transmission of the stored data thereto.

By this form of presentation and function, values can be watched over time, and it is not necessary that the user is present all the time. Moreover, by means of such records, an air-conditioning system can be easily evaluated and optimized with regard to the final setting in a trial operation. This particularly facilitates fine adjustments. In other words, the service device is capable of presenting measured values over time as graphics or storing them as data set and/or of transmitting them set off or as data package to a server, in this way providing recommendations for action or protocol data to the user.

Finally, the display of the service device can, e.g., be provided with symbols or the like, which are controllable or can be activated, and which can signalize recommendations for action to the user. Upon activation, said controlled symbols can provide help information in the form of text, language, image or film sequence on the display.

Figure 13:
FIG. 13 shows a possible embodiment of a circular display on which a measured value is shown in the form of a pointer and in the form of a number.

FIG. 13 shows an enlarged top view of a display in the form of an individual display 30 for a measured value. The design of the display 30 shown here can, e.g., also be used in the respective inspection cut-outs of the device embodiments according to FIGS. 4B, 4C. The display is a digitally controllable display element (e.g., a screen, an LCD, an OLED, etc.) that shows the measured value as number as well as by means of a digital pointer 40 on the periphery of the display. In the normal measurement operation, the pointer 40 changes its position in accordance with the present measured value. Often, however, there are also values that do not change over a long period of time, such as the pressure in the air-conditioning system when this is inoperative. When there are such static display states, any technician taking a reading could have doubts about the correctness of the measured value or the correct connection to the sensor.

A correct connection to the sensor or the correctness of the measured value can, e.g., be signaled by a light, LED to constant green or flashing, but also the operational mode hinted at here can be used. Accordingly, during a specific time interval, the electronic pointer 27 briefly changes its position, e.g., by an increment downwards 27" and/or upwards 27'. This shows the user that the display works without any faults. In FIG. 13, the adjacent pointer positions 27', 27", which can be briefly activated, are shown in this example as dotted lines. The display 30 has several LEDs 26 distributed along its periphery. These LEDs 26 serve to illuminate the display.

It will be readily understood that the components of various embodiments of the present invention, as generally described and illustrated in the figures herein, may be arranged and designed in a wide variety of different configurations. Thus, the detailed description of the embodiments of the present invention, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. A service device for air-conditioning systems, comprising:
   an electronically controllable display;
   a display controller connected to the electronically controllable display and configured to control the electronically controllable display;
   a housing;
   a high-pressure port comprising an associated valve;
   a low-pressure port comprising an associated valve;
   a service port;
   a pressure sensor port on a low-pressure side;
   a pressure sensor port on a high-pressure side;
   an electronic evaluation unit; and
   a port by which the evaluation unit is connectable to external temperature probes, a port for an external vacuum sensor, or both, wherein
   the electronic evaluation unit is provided with and fed by an energy storing device, connected to keys, configured to be connected to internal pressure sensors that are tightly connected to the pressure-sensor ports, and comprises a data memory, and
   the display controller further configured to cause the electronically controllable display to:
      show successively detected measured values for at least one pressure detected by the service device on the electronically controllable display in an analog representation as a virtual pointer instrument in order to output the measured values in analog as pointer values, or in analog as pointer values and as digital numerical values at the same time,
      change the analog representation on the virtual pointer instrument upon a change in the successively detected measured values,
      show the determined measured values on the electronically controllable display in analog and dynamically in relation to final values, and
   displayed vapor pressure temperatures are calculated in accordance with a selected refrigerant and a measured pressure.

2. The service device of claim 1, wherein the display controller is further configured to display measured values of pressure and/or vacuum as pointers on a circular or partially circular scale extending between changeable final values.

3. The service device of claim 1, wherein the display controller is further configured to dynamically show an analog pointer value at the same time as, and relative to, an adjustable memory marking.

4. The service device of claim 1, wherein the service device further comprises:
   a plurality of pressure ports having a first common symmetrical axis, wherein
   the electronically controllable display comprises a viewing axis, and
   the first common symmetrical axis of the ports is inclined relative to a viewing axis of the electronically controllable display.

5. The service device of claim 4, wherein the first common symmetrical axis of the ports is inclined with respect to the viewing axis of the display at between 20° and 70°.

6. The service device of claim 1, wherein the electronically controllable display is circular and the display controller is further configured to show a pointer position on the electronically controllable display via a LCD, a dot matrix, or a segment indication on the electronically controllable display.

7. The service device of claim 6, wherein the display controller is further configured to display the pointer position via a bar on a periphery of the electronically controllable display and display an associated digital numerical value on the electronically controllable display.

8. The service device of claim 1, wherein the display controller is further configured to control the electronically controllable display such that a measurement activity or a tendency is signaled by a pointer changing position or flashing in a pulsed manner.

9. The service device of claim 1, further comprising:
   an optical device interface configured to be coupled to a mobile receiver, wherein
   the display controller is configured to control the electronically controllable display to image a machine-readable code, a QR code, or a bar code.

10. The service device of claim 1, wherein the display controller is further configured to output data via a flashing frequency of a lamp, or an LED or a section of the electronically controllable display.

11. The service device of claim 1, wherein the service device is sealed via a plastic overmolding of an inspection glass that covers the electronically controllable display.

12. The service device of claim 1, wherein a part of the service device with a display is detachable from a remainder of the service device, or the part of the service device with the display is connectable to the service device via a plug-in socket or configured, as a self-sufficient device, to communicate wirelessly with an evaluation unit.

13. The service device of claim 1, wherein the electronically controllable display is touch-sensitive and is provided with switching functions or key functions.

14. An apparatus, comprising:
   an electronically controllable display;
   a display controller connected to the electronically controllable display and configured to control the electronically controllable display;
   a housing;
   a high-pressure port comprising an associated valve;
   a low-pressure port comprising an associated valve;
   a service port;
   a pressure sensor port on a low-pressure side;
   a pressure sensor port on a high-pressure side;
   an electronic evaluation unit; and
   a port by which the evaluation unit is connectable to external temperature probes, a port for an external vacuum sensor, or both, wherein
   the electronic evaluation unit is provided with and fed by an energy storing device, connected to keys, configured to be connected to internal pressure sensors that are tightly connected to the pressure-sensor ports, and comprises a data memory, the display controller further configured to cause the electronically controllable display to:
- show successively detected measured pressure values detected by the apparatus on the electronically controllable display in an analog representation for low-pressure and high-pressure ranges of an air-conditioning system as a virtual pointer instrument in order to output the measured values in analog as pointer values, or in analog as pointer values and as digital numerical values at the same time,
- show the determined measured values on the electronically controllable display in analog and dynamically in relation to final values, and
- display vapor pressure temperatures calculated in accordance with a selected refrigerant and a measured pressure.

15. The apparatus of claim 14, further comprising:
a key that, when pressed, causes the apparatus to store a position pointer in accordance with a measured value and causes the display controller to cause the display to show a marking on the virtual pointer instrument.

16. An apparatus, comprising:
an electronically controllable display;
a display controller connected to the electronically controllable display and configured to control the electronically controllable display;
a housing;
a high-pressure port comprising an associated valve;
a low-pressure port comprising an associated valve;
a service port;
a pressure sensor port on a low-pressure side;
a pressure sensor port on a high-pressure side;
an electronic evaluation unit; and
a port by which the evaluation unit is connectable to external temperature probes, a port for an external vacuum sensor, or both, wherein the electronic evaluation unit is provided with and fed by an energy storing device, connected to keys, configured to be connected to internal pressure sensors that are tightly connected to the pressure-sensor ports, and comprises a data memory, the display controller further configured to cause the electronically controllable display to:
- show a virtual pointer instrument providing an analog representation for low-pressure and high-pressure side scales of an air-conditioning system,
- show successively detected measured pressure values for at least one pressure detected by the apparatus on the virtual pointer instrument as a low-pressure side scale and a high-pressure side scale in order to output the measured values in analog as pointer values, or in analog as pointer values and as digital numerical values at the same time,
- change the analog representation on the low-pressure side scale, the high-pressure side scale, or both, upon a change in the successively detected measured values,
- show the determined measured values on the electronically controllable display in analog and dynamically in relation to final values, and display vapor pressure temperatures calculated in accordance with a selected refrigerant and a measured pressure.

* * * * *